(12) United States Patent
Sun et al.

(10) Patent No.: US 12,332,679 B2
(45) Date of Patent: Jun. 17, 2025

(54) HIGH OUTPUT IMPEDANCE CURRENT MIRROR CIRCUIT

(71) Applicant: Apple Inc., Cupertino, CA (US)

(72) Inventors: Bo Sun, Carlsbad, CA (US); Jafar Savoj, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 114 days.

(21) Appl. No.: 17/820,143

(22) Filed: Aug. 16, 2022

(65) Prior Publication Data

US 2024/0061460 A1   Feb. 22, 2024

(51) Int. Cl.
*G05F 3/26* (2006.01)
*H03K 19/0185* (2006.01)
*G05F 3/16* (2006.01)

(52) U.S. Cl.
CPC ............... *G05F 3/262* (2013.01); *G05F 3/26* (2013.01); *H03K 19/018521* (2013.01); *G05F 3/16* (2013.01)

(58) Field of Classification Search
CPC .. G05F 3/26; G05F 3/262; G05F 3/16; H03K 19/018521
See application file for complete search history.

(56) References Cited

U.S. PATENT DOCUMENTS

| | | | |
|---|---|---|---|
| 6,580,326 B2 | 6/2003 | Bach et al. | |
| 9,311,996 B2 | 4/2016 | Ogiwara et al. | |
| 10,585,447 B1* | 3/2020 | Tanimoto | G05F 3/262 |
| 10,992,290 B2 | 4/2021 | Kim et al. | |
| 2023/0198394 A1* | 6/2023 | Jiang | G05F 1/565 |
| | | | 323/282 |
| 2024/0053781 A1* | 2/2024 | Fiocchi | G05F 1/575 |

* cited by examiner

*Primary Examiner* — Gary L Laxton
(74) *Attorney, Agent, or Firm* — Kowert, Hood, Munyon, Rankin & Goetzel, P.C.; Dean M. Munyon

(57) ABSTRACT

A current mirror circuit included in a computer system that includes a mirror stage circuit and a feedback circuit is disclosed. The mirror stage circuit generates a mirror current in an output node using a reference current. The feedback circuit adjusts the value of the mirror current based on a voltage level of the output node to increase the output impedance of the current mirror circuit.

20 Claims, 9 Drawing Sheets

//www.w3.org/ns/prov#">
HIGH OUTPUT IMPEDANCE CURRENT MIRROR CIRCUIT

BACKGROUND

Technical Field

This disclosure relates to analog circuits in computer systems and, more particularly, to current mirror circuits.

Description of the Related Art

Modern computer systems include both analog/mixed-signal and digital circuits. Digital circuits can be used to perform logic and arithmetic functions, data storage, and the like. Analog/mixed-signal circuits can be used to sense and receive input/output (I/O) signals, conversion of analog signals into digital signals, conversion of digital signals into analog signals, and the like.

Digital circuits are constructed from logic gates which perform corresponding logic functions. For example, a digital circuit can include NAND gates which generate an output signal that is a negation of an AND operation of two or more input digital signals. Some digital circuits also include storage circuits, e.g., latch circuits or flip-flop circuits, that can be used to create sequential logic circuits such as counter circuits or state machine circuits.

Analog and mixed-signal circuits often employ bias circuits to set the operating points of amplifier circuits and the like. Such bias circuit can include voltage and current reference circuits. In some cases, rather than creating multiple current reference circuits, some computer systems employ current mirror circuits that can be used to create additional reference currents that are replicas of a base reference current.

Figure 1:
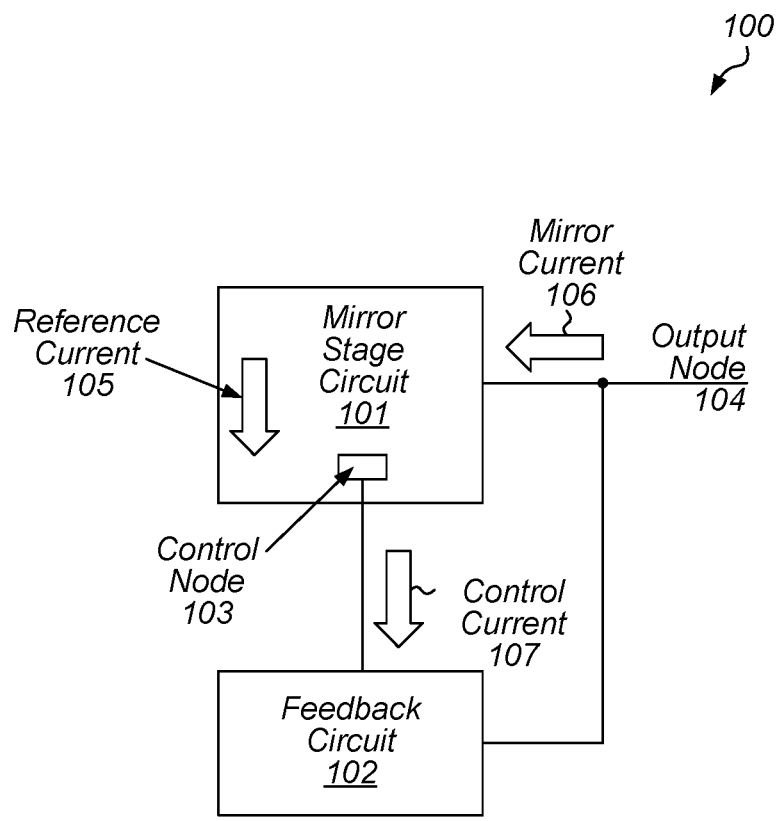
FIG. 1 is a block diagram of an embodiment of a current mirror circuit for a computer system.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed but, on the contrary, the intention is to cover all modifications, equivalents and alternatives falling within the spirit and scope of the appended claims.

DETAILED DESCRIPTION OF EMBODIMENTS

Computer systems may include multiple circuit blocks configured to perform specific functions. Such circuit blocks may include digital circuits (e.g., processor circuits) as well as analog, mixed-signal, and radio-frequency (RF) circuits. Such analog, mixed-signal, and radio-frequency (RF) circuits may include sensor circuits, transceiver circuit, power converter circuits, voltage regulator circuits, and the like.

Many analog, mixed-signal, sensor, and RF circuits rely upon precision voltage reference circuits that generate reference voltages that vary little with respect to operational parameters (e.g., supply voltage level, temperature, etc.) of the reference circuit. Such precision circuits often rely on bandgap circuits, which create a voltage level that is based on the band gap of silicon, providing the needed precision and stability. In many cases the reference voltages may be used to create reference currents that can be used to bias other circuits such as amplifier circuits.

Rather than generating multiple current reference circuits, reference currents can be replicated (or "mirrored") using current mirror circuits to generate multiple reference currents. Current mirror circuits rely on two devices sharing a common control node that allows a current flowing through one device to be mirrored in the other device. Adjusting the relative sizes between the two devices allows for the input current to be scaled up or down during the mirroring process.

Current mirror circuits typically have a low output impedance which can result in undesirable variation in a mirror current as the output voltage of a current mirror circuit changes. For example, an increase the voltage level of the output node of a current mirror circuit can result in an increase in the value of the mirror current. Some current mirror circuits employ a cascode output stage to improve their output impedance. In such circuits, a biased device is place in series with the output of a current mirror circuit, which isolates a mirror device in the current mirror circuit from changes in the voltage level on the output the current mirror circuit, thereby reducing variation in the mirror current.

In response to scaling of semiconductor manufacturing technology, power supply voltage levels have dropped, reducing the available voltage range needed to maintain devices in voltage reference circuits operating in saturation (referred to as "head room"). In some cases, the head room is sufficiently small that using a cascode output stage, as well as other circuit techniques, in a current mirror circuit is impractical as the supply voltage is too low to maintain the devices in the cascode output stage in saturation.

The embodiments illustrated in the drawings and described below provide techniques for increasing the output impedance of a current mirror circuit which can be employed in low-voltage power supply applications. Through the use of a feedback circuit, the voltage level of the control node of a current mirror circuit can be adjusted based on the voltage level of the output node of the current mirror circuit. By adjusting the voltage level of the control node, the value of the mirror current can be modified to maintain its desired level when the output voltage of the current mirror changes.

A block diagram of an embodiment of a current mirror circuit is depicted in FIG. 1. As illustrated, current mirror circuit 100 includes mirror stage circuit 101 and feedback circuit 102.

Mirror stage circuit 101 include control node 103, and is configured to generate a mirror current in output node 104 using reference current 105 and a voltage level of control node 103. In some embodiments, to generate the mirror current, mirror stage circuit 101 is configured to sink mirror current 106 from output node 104 while, in other embodiments, mirror stage circuit 101 is configured to source mirror current 106 to output node 104.

Feedback circuit 102 is configured to modify a voltage level of control node 103 using a voltage level of output node 104. As described below, to modify the voltage level of control node 103, feedback circuit 102 may be further configured to sink or source control current 107 from or to control node 103. In various embodiments, feedback circuit 102 may be further configured to perform a level-shift operation using the voltage level of output node 104 to generate a scaled voltage level. In some embodiments, feedback circuit 102 may be further configured to generate control current 107 using the scaled voltage level.

Figure 2:
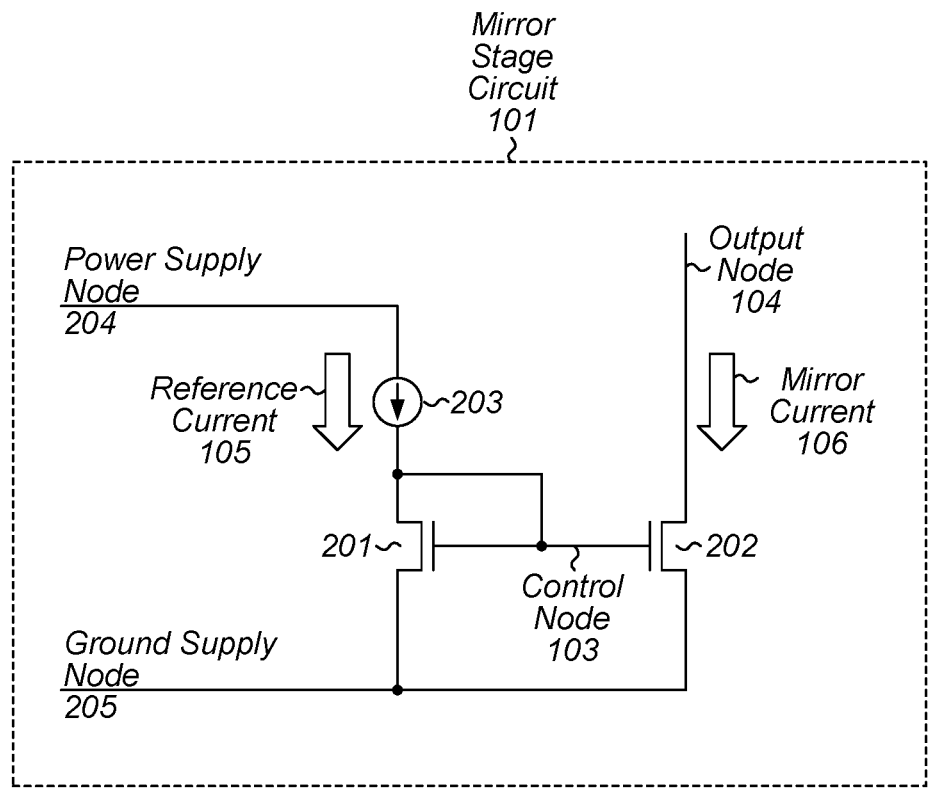
FIG. 2 is a block diagram of an embodiment of a mirror stage circuit for a current mirror circuit.

Turning to FIG. 2, a block diagram of an embodiment of mirror stage circuit 101 is depicted. As illustrated, mirror stage circuit 101 includes devices 201 and 202, and current source 203.

Current source 203 is coupled between power supply node 204 and control node 103, and is configured to source reference current 105 to control node 103. In various embodiments, current source 203 may be implemented as a biased device, part of a different current mirror circuit, or any other suitable current source circuit.

Device 201 is coupled between control node 103 and ground supply node 205, and is controlled by a voltage level of control node 103. Device 202 is coupled between output node 104 and ground supply node 205, and is controlled by the voltage level of control node 103. In various embodiments, devices 201 and 202 may be implemented as n-channel metal-oxide semiconductor field-effect transistors (MOSFETs), Fin field-effect transistors (FinFETs), gate-all-around field-effect transistors (GAAFETs), or any other suitable transconductance devices. It is noted that, in some embodiments, device 201 and device 202 may have similar widths and that, in other embodiments, the width of device 202 may be less than or greater than the width of device 201.

Reference current 105 flows through device 201 into ground supply node 205. As reference current 105 flows through device 201, a voltage is developed on control node 103. The voltage level of control node 103 determines a conductance of device 202, resulting in mirror current 106 to flow from output node 104 into ground supply node 205. Since both device 201 and device 202 are controlled by the voltage level of control node 103, mirror current 106 has the same value as reference current 105.

As described below, an increase in the voltage level of output node 104 results in an increase in the value of control current 107. The increase in value of control current 107 reduces the voltage on control node 103, resulting in less current flowing in device 201 and 202. The reduction in the current in device 202 in response to an increase in the voltage level of output node 104, effectively increases the output impedance of device 202.

In various embodiments, the value of mirror current 106 can be adjusted relative to reference current 105 by changing the electrical properties of device 202 relative to device 201. Such changes may be accomplished by adjusting one or more physical properties of device 202 relative to device 201. For example, a width of device 202 may be twice a width of device 201, resulting in mirror current 106 being twice as large as reference current 105.

Although the embodiment of FIG. 2 is depicted as being implemented using n-channel devices, in other embodiments, mirror stage circuit 101 may be implemented using a p-channel devices instead of n-channel devices (referred to as a "p-channel dual" of the circuit) of the illustrated embodiment. In such a case, mirror current 106 may be sourced to output node 104 instead of sunk from output node 104.

Figure 3:
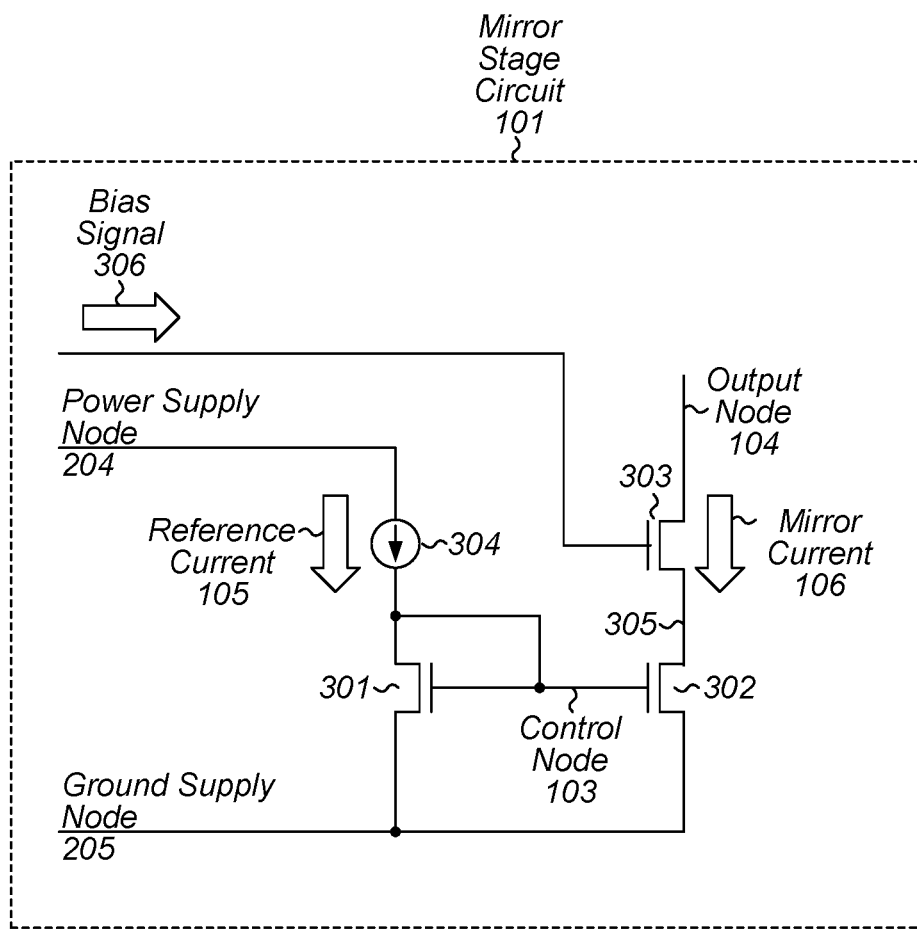
FIG. 3 is a block diagram of another embodiment of a mirror stage circuit for a current mirror circuit.

As mentioned above, the use of feedback circuit 102 can improve the output impedance of current mirror circuit 100 in cases where the voltage level of a power supply node is too low to allow for a cascode output in mirror stage circuit 101. In some embodiments, however, feedback circuit 102 can be used in conjunction with a cascode output stage in mirror stage circuit 101. A block diagram of an embodiment of mirror stage circuit 101 that includes a cascode output stage is depicted in FIG. 3. As illustrated, mirror stage circuit 101 includes devices 301-303, and current source circuit 304.

Current source circuit 304 is coupled between power supply node 204 and control node 103, and is configured to source reference current 105 to control node 103. In various embodiments, current source circuit 304 may be implemented as a biased device, part of a different current mirror circuit, or any other suitable current source circuit.

Device 301 is coupled between control node 103 and ground supply node 205, and is controlled by a voltage level of control node 103. Device 302 is coupled between node 305 and ground supply node 205, and is controlled by the voltage level of control node 103. Device 303 is coupled between output node 104 and node 305, and is controlled by bias signal 306. In various embodiments, devices 301-303 may be implemented as n-channel MOSFETs, FinFETs, GAAFETs, or any other suitable transconductance devices. It is noted that, in some embodiments, device 301 and device 302 may have similar physical widths while in other embodiments the width of device 302 may be greater than or less than the width of device 301.

Reference current 105 flows through device 301 into ground supply node 205. As reference current 105 flows through device 301, a voltage is developed on control node 103. The voltage level of control node 103 determines a conductance of device 302, resulting in mirror current 106 to flow from output node 104, through device 303, and into ground supply node 205. Since both device 301 and device 302 are controlled by the voltage level of control node 103, mirror current 106 has the same value as reference current 105.

Device 302 is shielded from fluctuations in the voltage level of output node 104 by device 303. The shielding provided by device 303 results in changes in the voltage level of output node 104 having less effect on the value of mirror current 106, thereby increasing the output impedance of mirror stage circuit 101. As described above, by adjusting the voltage level of control node 103 based on the voltage level of output node 104, further increases in the output impedance of mirror stage circuit 101 are possible. It is noted that a value of bias signal 306 may be selected based on a conductance needed between output node 104 and node 305 in order to allow mirror current 106 to flow through device 303.

Although the embodiment of FIG. 3 is depicted as being implemented using n-channel devices, in other embodiments, mirror stage circuit 101 may be implemented using a p-channel dual of the illustrated embodiment. In such a case, mirror current 106 may be sourced to output node 104 instead of sunk from output node 104.

Figure 4:
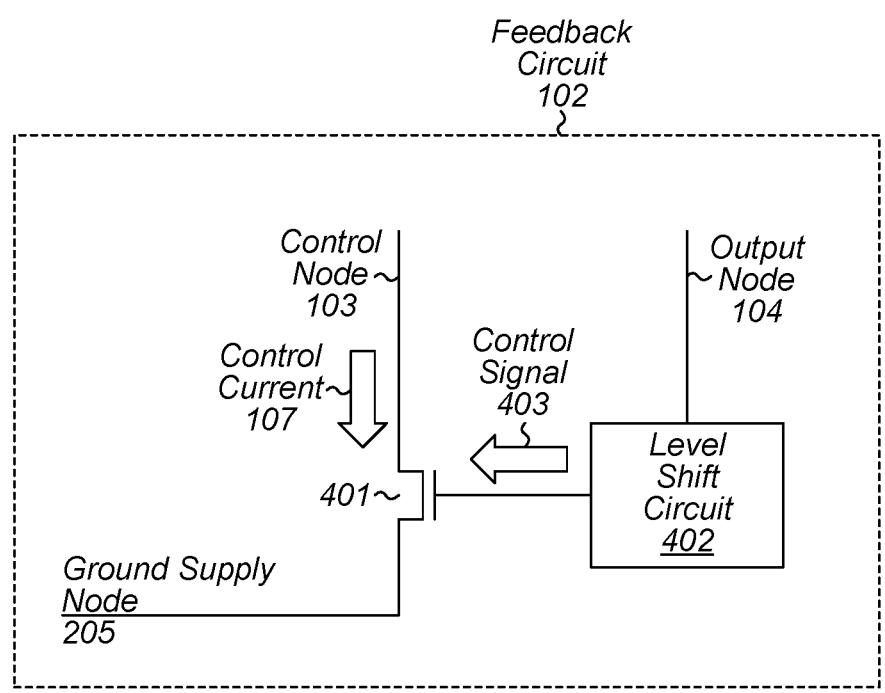
FIG. 4 is a block diagram of an embodiment of a feedback circuit for a current mirror circuit.

Turning to FIG. 4, a block diagram of an embodiment of feedback circuit 102 is depicted. As illustrated, feedback circuit 102 includes device 401 and level shift circuit 402.

Device 401 is coupled between control node 103 and ground supply node 205. In various embodiments, device 401 is configured to sink control current 107 from control node 103 using control signal 403. To sink control current 107 from control node 103, device 401 is further configured to adjust a conductance between control node 103 and ground supply node 205. For example, as a voltage level of control signal 403 increases, the conductance of device 401 increases, thereby increasing the value of control current 107. Device 401 may be implemented as an n-channel MOSFET, FinFET, GAAFET, or any other suitable transconductance device. It is noted that although device 401 is depicted as a single device, in other embodiments, device 401 may include multiple devices coupled to one another in parallel.

Level shift circuit 402 is configured to generate control signal 403 using a voltage level of output node 104. In various embodiments, a voltage level of control signal 403 is a scaled voltage level that may be less than the voltage level of output node 104. As described below, the difference between the respective voltage levels of output node 104 and control signal 403 may be based on a difference between threshold devices included in level shift circuit 402. In various embodiments, the difference between the respective voltage levels of output node 104 and control signal 403 may be selected based on a desired amount of feedback to be used in current mirror circuit 100.

As the voltage level of output node 104 increases, the voltage level of control signal 403 also increases. Such an increase the voltage level of control signal 403 increases the conductance of device 401, reducing the resistance between control node 103 and ground supply node 205. As the resistance between control node 103 and ground supply node 205 decreases, the value of control current 107 increases. As noted above, an increase in the value of control current 107 results in a decrease in the voltage level of control node 103, resulting in a decrease in the current flowing in device 202, which effectively increases the output impedance of device 202.

It is noted that in cases where the p-channel dual of mirror stage circuit 101 is employed, device 401 may be coupled between control node 103 and a power supply node and may be implemented as a p-channel MOSFET, FinFET, GAAFET, or other suitable transconductance device. In such cases, device 401 can be configured to source a current to control node 103 by adjusting a conductance between the power supply node and control node 103.

Figure 5:
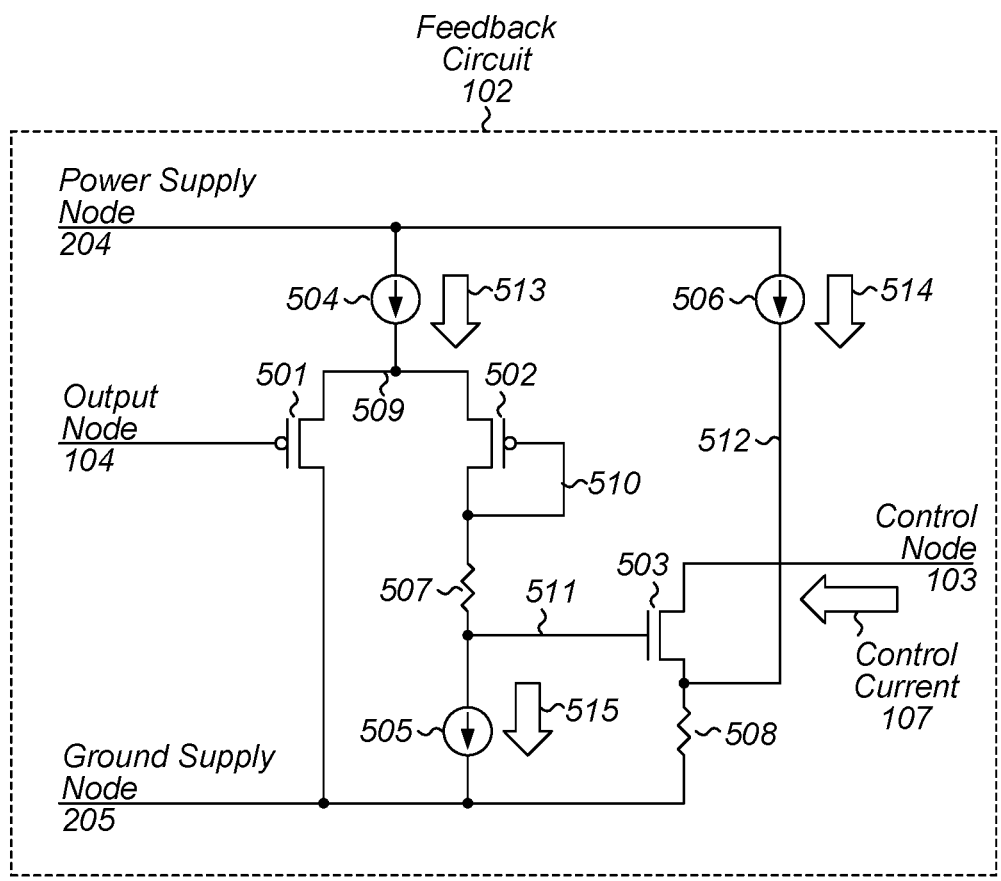
FIG. 5 is a block diagram of a different embodiment of a feedback circuit for a current mirror circuit.

Turning to FIG. 5, a block diagram of a different embodiment of feedback circuit 102 that includes circuit elements that correspond to both device 401 and level shift circuit 402 is depicted. As illustrated, feedback circuit 102 includes devices 501-503, current sources 504-506, and resistors 507 and 508.

Current source 504 is coupled between power supply node 204 and node 509, and is configured to source current 513 to node 509. In various embodiments, current 513 provides a bias for devices 501 and 502. The value for current 513 may be selected based on the voltage level of power supply node 204, a nominal voltage of output node 104, or any other suitable characteristics.

Device 501 is coupled between node 509 and ground supply node 205. A control terminal of device 501 is coupled to output node 104. Device 502 is coupled between node 509 and node 510. A control terminal of device 502 is coupled to node 510. In various embodiments, a threshold voltage of device 501 is different than a threshold voltage of device 502. For example, device 501 may be a standard threshold device, while device 502 may be an ultra-low threshold device.

Device 501 is configured to sink a current from node 509 based on the voltage level of output node 104. In a similar fashion, device 502 is configured to sink a different current from node 509. Since the threshold voltages of devices 501 and 502 are different, along with the fact that the control terminal of device 502 is coupled to its drain terminal, the voltage level developed on node 510 is less than the voltage level of output node 104. In various embodiments, the voltage level of node 510 may be less than the voltage level of output node 104 by an amount corresponding to a difference between the threshold voltage of device 501 and the threshold voltage of device 502.

Resistor 507 is coupled between node 510 and node 511. Current source 505 is coupled between node 511 and ground supply node 205, and configured to sink current 515 from node 511. In various embodiments, a voltage drop is developed across resistor 507 resulting from the current flowing through device 502 and current 515. The value of resistor 507 and current 515 may be selected based on a desired adjustment to the voltage level of node 510 in order to generate a suitable value for control current 107.

Device 503 is coupled between control node 103 and node 512. In various embodiments, device 503 may correspond to device 401 and is configured to adjust a conductance between control node 103 and node 512 based on a voltage level of node 511 and to generate control current 107.

Current source 506 is coupled between power supply node 204 and node 512, and is configured to source current 514 to node 512. Resistor 508 is coupled between node 512 and ground supply node 205. In various embodiments, current flowing through resistor 508, which is a combination of current 514 and control current 107, generates a voltage drop across resistor 508 setting a source voltage for device 503. Values for current 514 and resistor 508 may be selected to compensate for variation across different semiconductor manufacturing processes, allowing feedback circuit 102 to be used on different semiconductor manufacturing processes with minimal adjustments.

In various embodiments, devices 501 and 502 may be implemented as p-channel MOSFETs, FinFETs, GAAFETs, or any other suitable transconductance devices. In some embodiments, device 503 may be implemented as an n-channel MOSFET, FinFET, GAAFET, or any other suitable transconductance device. It is noted that although devices 501-503 are depicted as single devices, in other embodiments, any of devices 501-503 may be implemented using multiple devices coupled together in parallel.

In various embodiments, current sources 504-506 may be implemented using bandgap reference circuits, current mirror circuits, or any other circuits configured to source constant currents. Resistors 507 and 508 may, in some embodiments, be implemented using polysilicon, metal, or any other suitable material available in a semiconductor manufacturing process.

It is noted that in cases where the p-channel dual of mirror stage circuit 101 is employed, feedback circuit 102 may be implemented using a p-channel device for device 503, wherein device 503 is configured to source control current 107 to control node 103, as opposed to sink control current 107 from control node 103 as depicted.

To summarize, various embodiments of a current mirror circuit that includes a feedback circuit are disclosed. Broadly speaking, an apparatus is contemplated in which a mirror stage circuit, that includes a control node, is configured to generate a mirror current from an output node using a reference current and a voltage level of the control node. The feedback circuit is configured to modify the voltage level of the control node using a voltage level of the output node. In a different embodiment, a first value of the mirror current is the same as a second value of the reference current.

In some embodiments, to modify the voltage level of the control node, the feedback circuit is further configured to sink a current from the control node. In such cases, a value of the control current is based on the voltage level of the output node. In various embodiments, to generate the mirror current, the mirror stage circuit is further configured to sink the mirror current from the output node. In other embodiments, to generate the mirror current the mirror stage circuit is further configured to source the mirror current to the output node.

In other embodiments, the feedback circuit is configured to perform a level shift operation using the voltage level of the output node to generate a shifted voltage level. In various embodiments, the feedback circuit is further configured to generate the control current using the shifted voltage level. In some embodiments, the feedback circuit includes a first device with a first threshold value and a second device with a second threshold value. In such cases, the feedback circuit is configured to generate the shifted voltage level such that a first difference between the voltage level of the output node and the shifted voltage level is based on a second difference between the first threshold value and the second threshold value.

Figure 6:
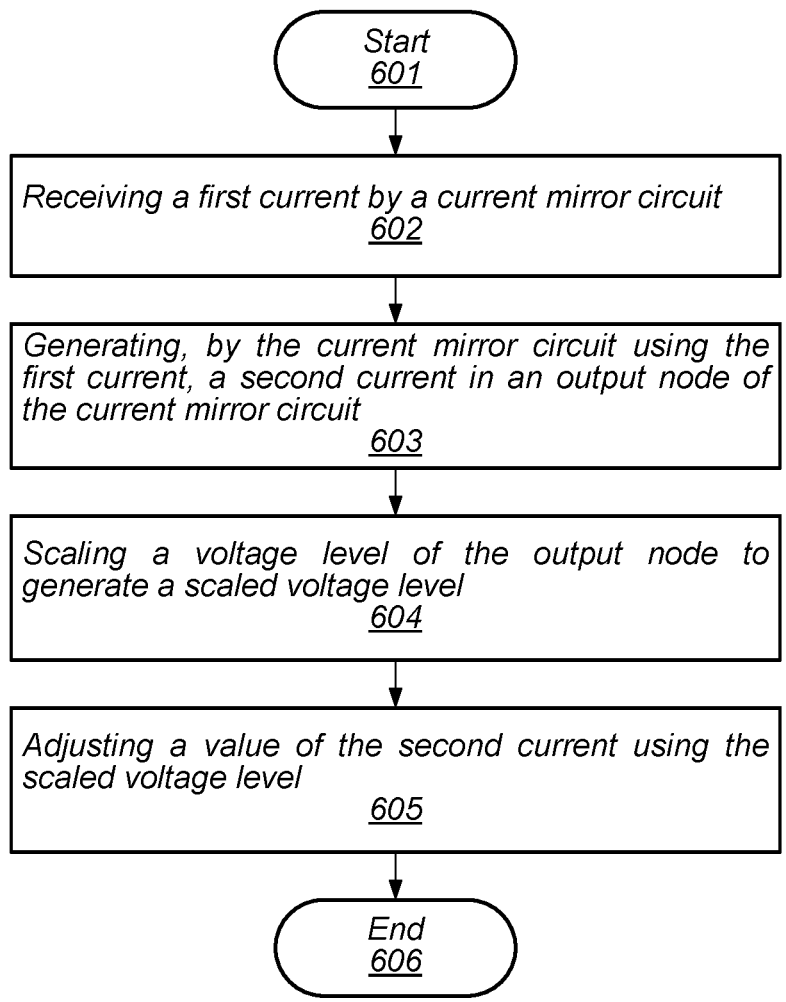
FIG. 6 is a flow diagram of an embodiment of a method for operating a current mirror circuit.

Turning to FIG. 6, a flow diagram depicting an embodiment of a method for operating a current mirror circuit is illustrated. The method, which may be applied to various current mirror circuits, including current mirror circuit 100, begins in block 601.

The method includes receiving a first current by a current mirror circuit (block 602). In various embodiments, the current mirror circuit includes first device and a second device whose respective control terminals are coupled to a control node included in the current mirror circuit. In such cases, receiving the first current may include sourcing the first current to the control node. In various embodiments, the current mirror circuit does not include a cascode output stage.

The method further includes generating, by the current mirror circuit using the first current, a second current in an output node of the current mirror circuit (block 603). In some embodiments, generating the second current in the output node includes sinking the second current from the output node. In other embodiments, generating the second current in the output node includes sourcing the second current to the output node.

The method also includes scaling a voltage level of the output node to generate a scaled voltage level (block 604). In some embodiments, the current mirror circuit includes a feedback circuit that includes a first device and a second device coupled to a common bias node. In such cases, scaling the voltage level of the output node includes generating the scaled voltage level using a difference between a first threshold value of the first device and a second threshold value of the second device.

The method further includes adjusting a value of the second current using the scaled voltage level (block 605). In some embodiments, adjusting the value of the second current includes modifying a voltage level of the control node using the scaled voltage level. In various embodiments, adjusting the value of the second current may be performed without the use of a cascode output stage. In other embodiments, modifying the voltage level of the control node includes sinking a control current from the control node, where a value of the control node is based on the scaled voltage level. In a different embodiment, modifying the voltage level of the control node includes sourcing the control current to the control node. The method concludes in block 606.

Figure 7:
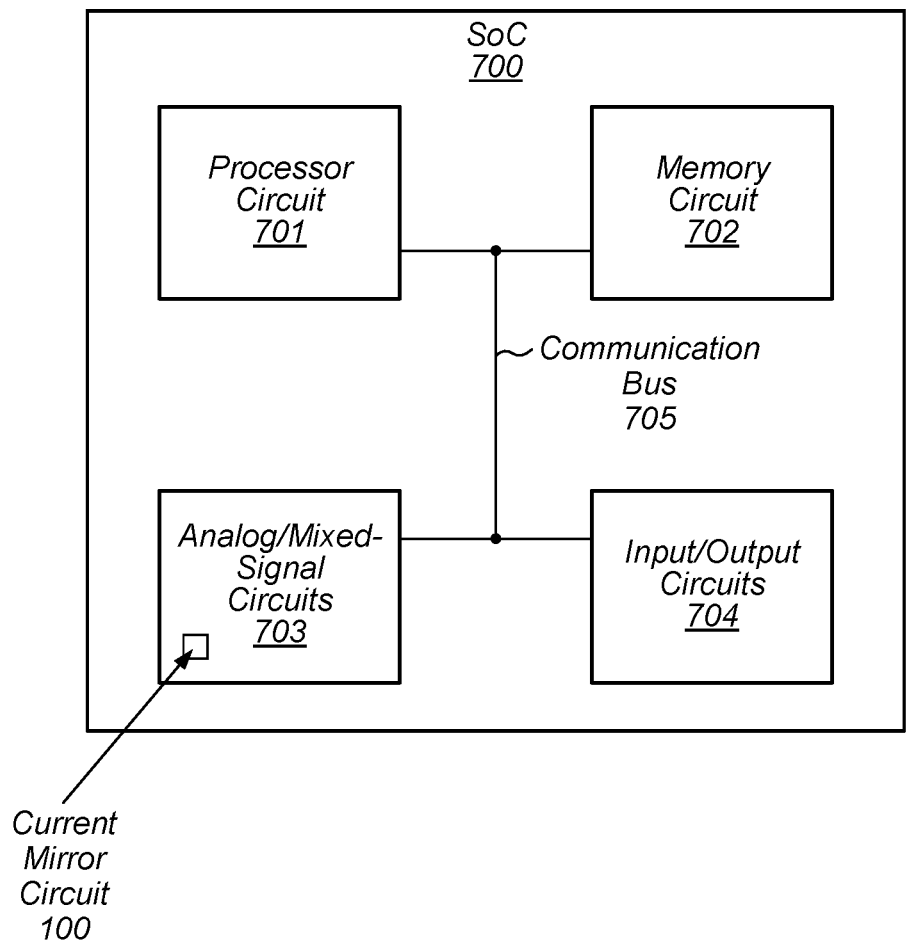
FIG. 7 is a block diagram of one embodiment of a system-on-a-chip that includes a voltage reference circuit.

A block diagram of a system-on-a-chip (SoC) is illustrated in FIG. 7. In the illustrated embodiment, SoC 700 includes processor circuit 701, memory circuit 702, analog/mixed-signal circuits 703, and input/output circuits 704, each of which is coupled to communication bus 705. In various embodiments, SoC 700 may be configured for use in a desktop computer, server, or in a mobile computing application such as, e.g., a tablet, laptop computer, or wearable computing device.

Processor circuit 701 may, in various embodiments, be representative of a general-purpose processor that performs computational operations. For example, processor circuit 701 may be a central processing unit (CPU) such as a microprocessor, a microcontroller, an application-specific integrated circuit (ASIC), or a field-programmable gate array (FPGA).

Memory circuit 702 may, in various embodiments, include any suitable type of memory such as a Dynamic Random-Access Memory (DRAM), a Static Random-Access Memory (SRAM), a Read-Only Memory (ROM), an Electrically Erasable Programmable Read-only Memory (EEPROM), or a non-volatile memory, for example. It is noted that although a single memory circuit is illustrated in FIG. 7, in other embodiments, any suitable number of memory circuits may be employed.

Analog/mixed-signal circuits 703 may include a crystal oscillator circuit, a phase-locked loop (PLL) circuit, an analog-to-digital converter (ADC) circuit, and a digital-to-analog converter (DAC) circuit (all not shown). In other embodiments, analog/mixed-signal circuits 703 may be configured to perform power management tasks with the inclusion of on-chip power supplies and voltage regulators. In some embodiments, analog/mixed-signal circuits 703 may include current mirror circuit 100 as depicted in FIG. 1.

Input/output circuits 704 may be configured to coordinate data transfer between SoC 700 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 704 may be configured to implement a version of Universal Serial Bus (USB) protocol or IEEE 1394 (Firewire®) protocol.

Input/output circuits 704 may also be configured to coordinate data transfer between SoC 700 and one or more devices (e.g., other computing systems or integrated circuits) coupled to SoC 700 via a network. In one embodiment, input/output circuits 704 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 704 may be configured to implement multiple discrete network interface ports.

Figure 8:
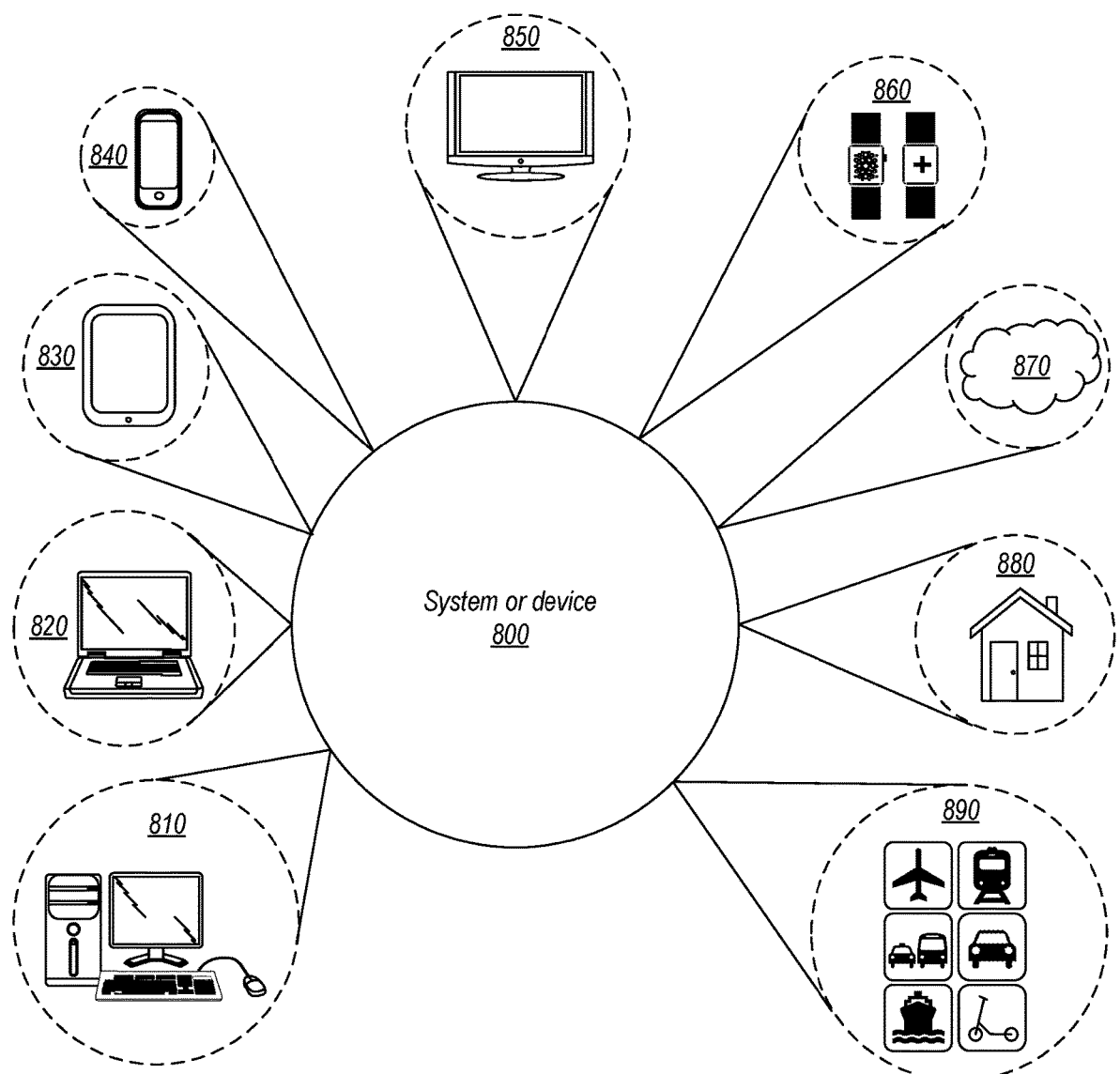
FIG. 8 is a block diagram of various embodiments of computer systems that may include power converter circuits.

Turning now to FIG. 8, various types of systems that may include any of the circuits, devices, or systems discussed above are illustrated. System or device 800, which may incorporate or otherwise utilize one or more of the techniques described herein, may be utilized in a wide range of areas. For example, system or device 800 may be utilized as part of the hardware of systems such as a desktop computer 810, laptop computer 820, tablet computer 830, cellular or mobile phone 840, or television 850 (or set-top box coupled to a television).

Similarly, disclosed elements may be utilized in a wearable device 860, such as a smartwatch or a health-monitoring device. Smartwatches, in many embodiments, may implement a variety of different functions for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 800 may also be used in various other contexts. For example, system or device 800 may be utilized in the context of a server computer system, such as a dedicated server or on shared hardware that implements a cloud-based service 870. Still further, system or device 800 may be implemented in a wide range of specialized everyday devices, including devices 880 commonly found in the home such as refrigerators, thermostats, security cameras, etc. The interconnection of such devices is often referred to as the "Internet of Things" (IoT). Elements may also be implemented in various modes of transportation. For example, system or device 800 could be employed in the control systems, guidance systems, entertainment systems, etc. of various types of vehicles 890.

The applications illustrated in FIG. 8 are merely exemplary and are not intended to limit the potential future applications of disclosed systems or devices. Other example applications include, without limitation: portable gaming devices, music players, data storage devices, unmanned aerial vehicles, etc.

Figure 9:
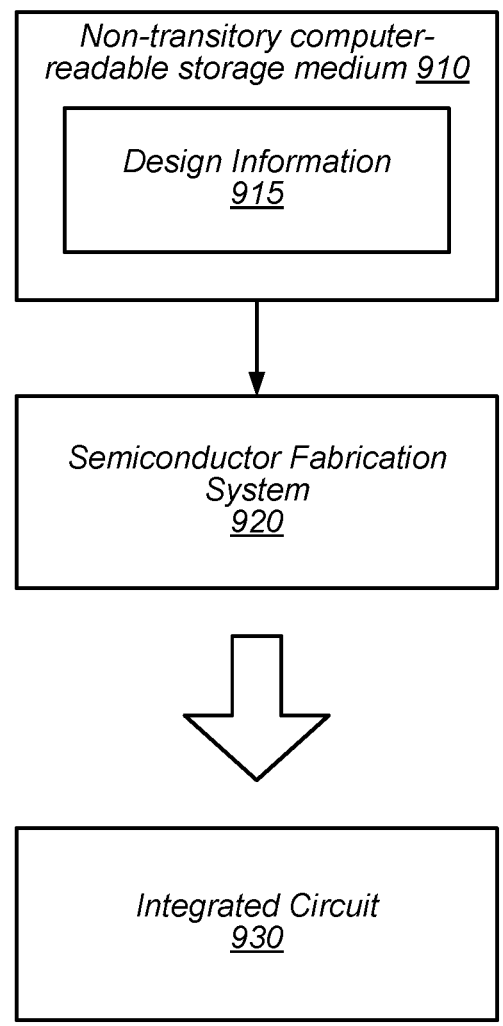
FIG. 9 illustrates an example of a non-transitory computer-readable storage medium that stores circuit design information.

FIG. 9 is a block diagram illustrating an example of a non-transitory computer-readable storage medium that stores circuit design information, according to some embodiments. In the illustrated embodiment, semiconductor fabrication system 920 is configured to process design information 915 stored on non-transitory computer-readable storage medium 910 and fabricate integrated circuit 930 based on design information 915.

Non-transitory computer-readable storage medium 910 may comprise any of various appropriate types of memory devices or storage devices. Non-transitory computer-readable storage medium 910 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash or magnetic media (e.g., a hard drive), or optical storage; registers, or other similar types of memory elements, etc. Non-transitory computer-readable storage medium 910 may include other types of non-transitory memory as well as combinations thereof. Non-transitory computer-readable storage medium 910 may include two or more memory mediums, which may reside in different locations, e.g., in different computer systems that are connected over a network.

Design information 915 may be specified using any of various appropriate computer languages, including hardware description languages such as, without limitation: VHDL, Verilog, SystemC, SystemVerilog, RHDL, M, MyHDL, etc. Design information 915 may be usable by semiconductor fabrication system 920 to fabricate at least a portion of integrated circuit 930. The format of design information 915 may be recognized by at least one semiconductor fabrication system, such as semiconductor fabrication system 920, for example. In some embodiments, design information 915 may include a netlist that specifies elements of a cell library, as well as their connectivity. One or more cell libraries used during logic synthesis of circuits included in integrated circuit 930 may also be included in design information 915. Such cell libraries may include information indicative of device or transistor level netlists, mask design data, characterization data, and the like, of cells included in the cell library.

Integrated circuit 930 may, in various embodiments, include one or more custom macrocells, such as memories, analog or mixed-signal circuits, and the like. In such cases, design information 915 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 920 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 920 may also be configured to perform various testing of fabricated circuits for correct operation.

In various embodiments, integrated circuit 930 is configured to operate according to a circuit design specified by design information 915, which may include performing any of the functionality described herein. For example, integrated circuit 930 may include any of various elements shown or described herein. Further, integrated circuit 930 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
 a mirror stage circuit including a control node, wherein the mirror stage circuit is configured to generate a mirror current in an output node based on a reference current and a first voltage level of the control node; and
 a feedback circuit configured to:

generate, using a voltage level of the output node, a scaled voltage level, wherein the scaled voltage level is generated based on a difference between transistors in the feedback circuit; and generate, based on the scaled voltage level, a control current such that an increase in a value of the control current results in a decrease of the voltage level of the control node.

2. The apparatus of claim 1, wherein to generate the mirror current, the mirror stage circuit is further configured to sink the mirror current from the output node, and wherein the difference between the transistors corresponds to a difference between threshold voltages of the transistors.

3. The apparatus of claim 1, wherein the decrease in the voltage level of the control node results in a decrease in a value of the mirror current.

4. The apparatus of claim 1, wherein the feedback circuit includes a first transistor with a first threshold voltage value and a second transistor with a second threshold voltage value distinct from the first threshold voltage value, and wherein the feedback circuit is further configured to generate the scaled voltage level such that a first difference between the voltage level of the output node and the scaled voltage level is based on a second difference between the first threshold voltage value and the second threshold voltage value.

5. The apparatus of claim 1, wherein the feedback circuit is coupled to the control node.

6. The apparatus of claim 1, wherein the mirror stage circuit and the feedback circuit are incorporated into an analog circuit, a mixed signal circuit, or both.

7. The apparatus of claim 6, wherein the analog circuit, the mixed signal circuit, or both are configured to perform one or more power management tasks.

8. A method, comprising:
receiving a first current by a current mirror circuit, wherein the current mirror circuit includes a feedback circuit that includes a first device having a first threshold voltage and a second device having a second threshold voltage different from the first threshold voltage, the first device and the second device coupled to a common bias node;

generating, by the current mirror circuit based on the first current, a second current in an output node;

scaling, by the feedback circuit, a voltage level of the output node to generate a scaled voltage level that differs from the voltage level of the output node by an amount that is based on a difference between the first threshold voltage and the second threshold voltage; and adjusting a value of the second current using the scaled voltage level.

9. The method of claim 8, wherein generating the second current in the output node includes sinking, by the current mirror circuit, the second current from the output node.

10. The method of claim 8, wherein generating the second current in the output node includes sourcing, by the current mirror circuit, the second current to the output node.

11. The method of claim 8, wherein receiving the first current includes sourcing the first current to a control node included in the current mirror circuit, wherein respective control terminals of the first device and the second device included in the current mirror circuit are coupled to the control node.

12. The method of claim 11, wherein adjusting the value of the second current includes modifying a voltage level of the control node using the scaled voltage level without using a cascode output stage.

13. The method of claim 12, wherein modifying the voltage level of the control node includes sinking a control current from the control node, wherein a value of the control current is based on the scaled voltage level.

14. An apparatus, comprising:
a first device coupled between a control node and a ground supply node, wherein the first device is configured to adjust a first conductance between the control node and the ground supply node based on a voltage level of the control node;

a second device coupled between an output node and the ground supply node, wherein the second device is configured to adjust a second conductance between the output node and ground supply node based on the voltage level of the control node;

a current source circuit configured to source a reference current to the control node; and a feedback circuit configured to:
generate, using a voltage level of the output node, a scaled voltage level, wherein the scaled voltage level is generated based on a difference between transistors in the feedback circuit; and generate, based on the scaled voltage level, a control current such that an increase in a value of the control current results in a decrease of the voltage level of the control node.

15. The apparatus of claim 14, wherein the difference between the transistors corresponds to a difference between threshold voltages of the transistors.

16. The apparatus of claim 14, wherein the decrease in the voltage level of the control node results in a decrease in a value of a mirror current at the output node.

17. The apparatus of claim 16, wherein the decrease in the value of the mirror current results in a decrease in an impedance at the output node.

18. The apparatus of claim 14, wherein the feedback circuit includes a third device and a fourth device coupled to a common bias node, and wherein to generate the scaled voltage level, the feedback circuit is further configured to generate the scaled voltage level using a difference between respective threshold voltages of the third device and the fourth device.

19. The apparatus of claim 14, further comprising a third device coupled between the second device and the output node, wherein the third device is configured to adjust, based on a bias signal, a third conductance between the output node and the second device.

20. The apparatus of claim 14, wherein a current flowing in the second device has a same value as the reference current.

* * * * *